(12) United States Patent
Tang et al.

(10) Patent No.: US 8,257,829 B2
(45) Date of Patent: Sep. 4, 2012

(54) FLUORESCENCE MATERIAL

(75) Inventors: Yu-Sheng Tang, Kaohsiung County (TW); Shu-Fen Hu, Hsinchu (TW); Ru-Shi Liu, Hsinchu (TW); Hung-Yuan Su, Taipei (TW); Cheng-Wen Tsai, Taipei (TW)

(73) Assignees: Silitek Electronic (Guangzhou) Co., Ltd., Guangzhou (CN); Lite-On Technology Corporation, Taipei (TW)

( * ) Notice: Subject to any disclaimer, the term of this patent is extended or adjusted under 35 U.S.C. 154(b) by 411 days.

(21) Appl. No.: 12/367,552

(22) Filed: Feb. 9, 2009

(65) Prior Publication Data

US 2010/0035042 A1   Feb. 11, 2010

(30) Foreign Application Priority Data

Aug. 7, 2008   (CN) .......................... 2008 1 0030113

(51) Int. Cl.
*B32B 5/16*   (2006.01)

(52) U.S. Cl. .......................... 428/403; 428/402; 523/200
(58) Field of Classification Search .......................... None
See application file for complete search history.

(56) References Cited

U.S. PATENT DOCUMENTS

| 2004/0195709 A1* | 10/2004 | Nakanishi et al. ............. 264/4.1 |
| 2006/0158089 A1* | 7/2006 | Saito et al. .................... 313/467 |

* cited by examiner

*Primary Examiner* — Mark Ruthkosky
*Assistant Examiner* — Gary Harris
(74) *Attorney, Agent, or Firm* — Li & Cai Intellectual Property (USA) Office

(57) ABSTRACT

The present invention fluorescence material has a particle diameter of the crystal area defined as $d_c$, and the scope of $d_c$ is: $150\ nm \geq d_c \geq 10\ nm$. The coat of the outside of the fluorescence material has one sheet of coating medium at least. Of course, there is at least a geometrical etching layer on the particle of the fluorescence material. The above-described structures will promote the extraction efficiency of light.

7 Claims, 11 Drawing Sheets

FLUORESCENCE MATERIAL

BACKGROUND OF THE INVENTION

1. Field of the Invention

The present invention is related to a fluorescence material applied to light emitting diode (LED) devices, and more particularly, to a structure of a fluorescence material.

2. Description of the Prior Art

It is an important objective for the illumination source technology field with actively researching and developing in this century to utilize LED devices for producing white light that is similar to the light color distribution of sunlight in order to substantially replace conventional white light illumination devices, such as fluorescent lamps. Currently, most of global package technology researchers of white light LED with single chip have working for develop blue light LED chips with wavelength of 440-460 nanometers (nm) and yttrium aluminum garnet (YAG) fluorescence powder, which can be excited by the blue light LED chip, for being mixed and packaged to produce white light. There is no definite operation method standard of packaging fluorescence powders in a white light LED package.

Furthermore, the technology of white light package has been widely discussed and researched. Therefore, how to improve the extraction efficiency of light becomes an important issue. For example, surface-roughening, arrangement of photonic crystal, and design of package structure are verified methods for effectively raising the extraction efficiency of light. In addition, the structure disposition of fluorescence powder layer has been valued gradually.

However, most of the researches have been emphasized on design of the whole structure of LED devices, or the coating disposition or structure variation of the fluorescence powder layer, and the research or discussion of fluorescence powder particle itself is very seldom.

In fact, the surface structure and size of the fluorescence powder particle do influence in the extraction efficiency of light. Therefore, to provide a fluorescence material for improving the extraction efficiency of light through the design of the particle structure of fluorescence material is essential for the manufacturers.

SUMMARY OF THE INVENTION

It is a primary objective of the present invention to provide a fluorescence material whose particle structure has an advantage of improving the extraction efficiency of light of the LED device, so as to solve the technical problem in the prior art.

To achieve the above-mentioned goal, a fluorescence material is provided, wherein a particle diameter of the crystal area of the particle of the fluorescence material is defined as $d_c$, and a range of the particle diameter meets the following equation: $150 \text{ nm} \geq d_c \geq 10 \text{ nm}$.

To achieve the above-mentioned goal, a fluorescence material is provided, wherein the ratio of the long axis to the short axis of the particle of the fluorescence material is defined as ratio r, and the ratio r has a range of: $3 \geq r \geq 1$.

To achieve the above-mentioned goal, a fluorescence material particle having a geometrical etching layer is provided.

Preferably, said etching layer has at least a shape of taper, rectangular bar, round, or cavity.

Preferably, said fluorescence powder is coated with at least a layer or sheet of coating medium on the outer surface of said fluorescence powder.

Preferably, an encapsulation is disposed out of said coating medium.

Preferably, the refractive index of said fluorescence material is larger than or equal to the refractive index of the coating medium, and the refractive index of the coating medium is larger than or equal to the refractive index of the encapsulation.

Preferably, the at least one layer of the coating medium has refractive indexes defined as $n_1, n_2, \ldots n_n$ from the inner side to the outer side, wherein the refractive indexes of the coating medium meet the following equation: the refractive index of the fluorescence material $\geq n_1 \geq n_2 \ldots \geq n_n \geq$ the refractive index of the encapsulation.

The fluorescence material applied to the LED package with the above-mentioned structure can improve the extraction efficiency of light.

These and other objectives of the present invention will no doubt become obvious to those of ordinary skill in the art after reading the following detailed description of the preferred embodiment that is illustrated in the various figures and drawings.

DETAILED DESCRIPTION

A further description of the present invention is in the following specification with reference to the figures.

The above-mentioned and other technology content, characteristics, and functionalities of the present invention will be clear illustrated in the following preferable embodiments with reference to the figures.

Noted that the similar elements of the present invention are labeled with the same numerals in the following specification.

Figure 3A:
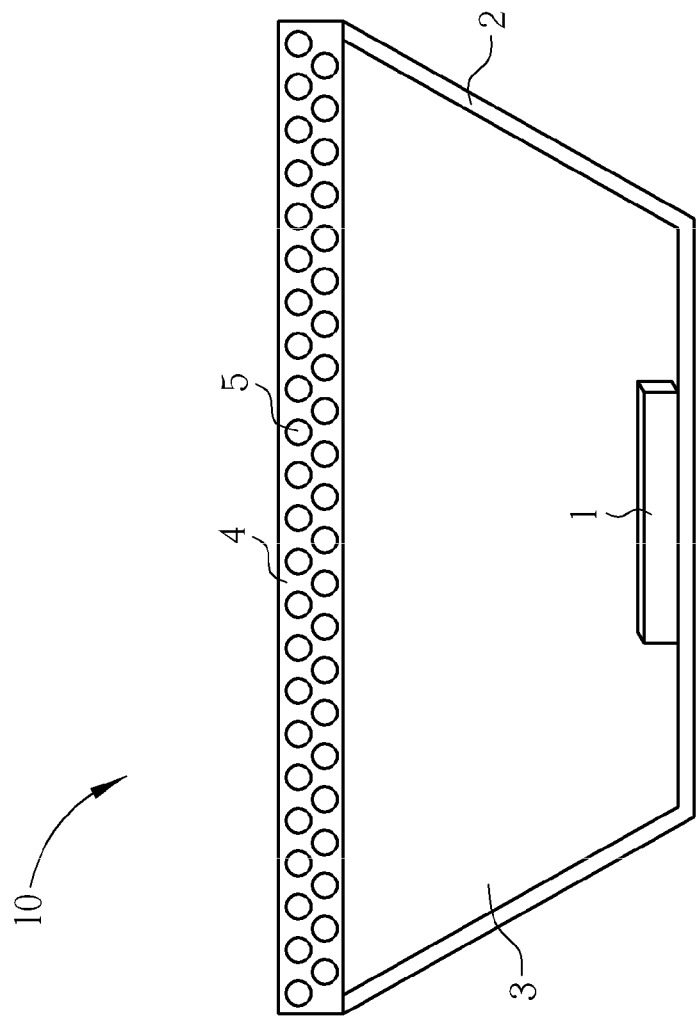
FIG. 3a is a schematic diagram of an LED package structure, wherein the metal lead frame is omitted.
Figure 3B:
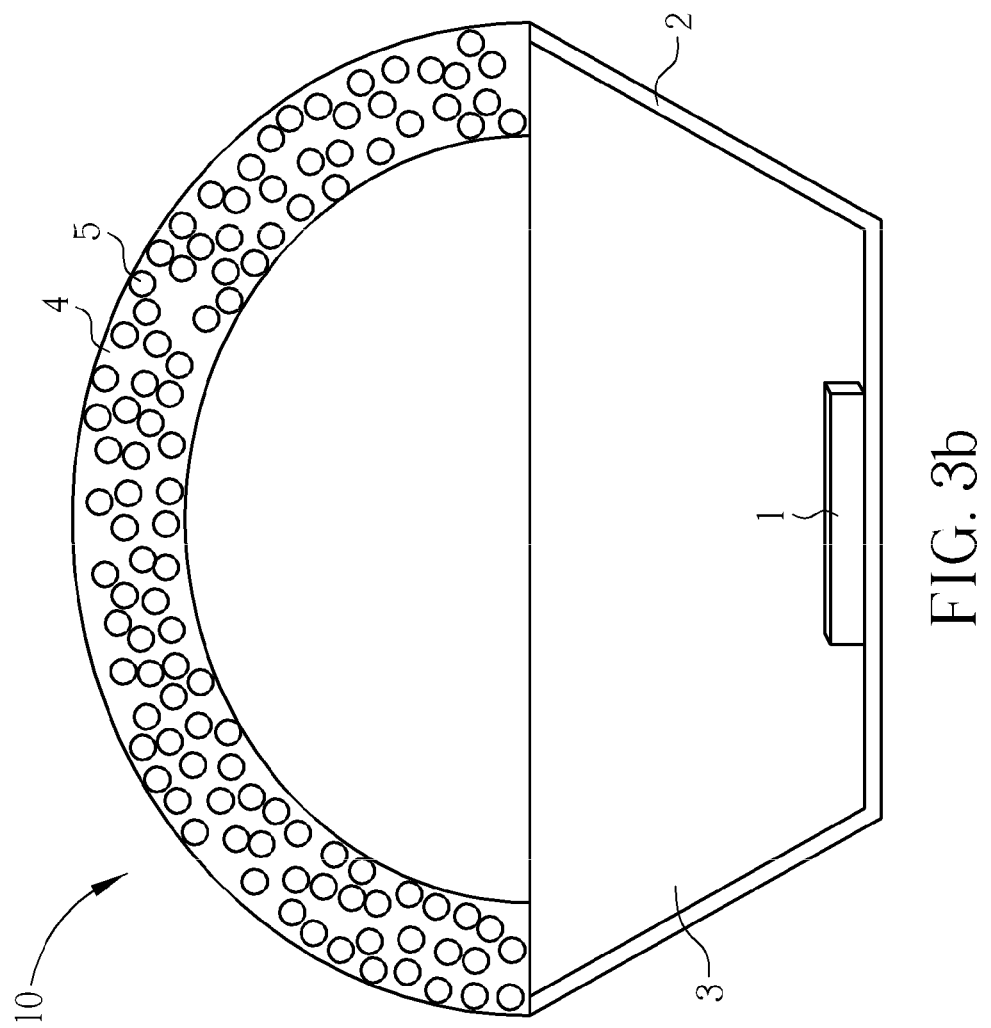
FIG. 3b is a schematic diagram of another LED package structure, wherein the metal lead frame is omitted.

FIGS. 3a-3b are schematic diagrams of the package structure of an LED respectively. Referring to FIG. 3a, the LED package 10 comprises a light-emitting chip 1, a reflecting layer 2, an encapsulation 3, and a fluorescence powder layer 4. Wherein, the light-emitting chip 1 is a poly-chip formed with semiconductor materials of group III-V, and the reflecting layer 2 is capable of reflecting light back that is scattered from the fluorescence powder layer 4 and improving roughness and reflection angles in order to avoid total reflection, so as to increase extraction efficiency of light. The fluorescence powder layer 4 is filled with fluorescence powder particles 5. With reference to FIG. 3b, FIG. 3b is a schematic diagram of another LED package structure, wherein the fluorescence powder layer 4 has an arc structure. The fluorescence powder layer 4 is composed of an inner mold and an outer mold, and the thickness of the fluorescence powder layer 4 is adjustable. The fluorescence powders are coated onto the spherical shell.

The light-emitting chip 1 is capable of emitting blue light with wavelength of 420-460 nm or ultraviolet with wavelength of 350-410 nm, such that the fluorescence powder layer 4 is excited by the blue light to produce yellow light, mixing with the blue light or ultraviolet so as to produce white light emitting out of the LED package 10.

Figure 1:
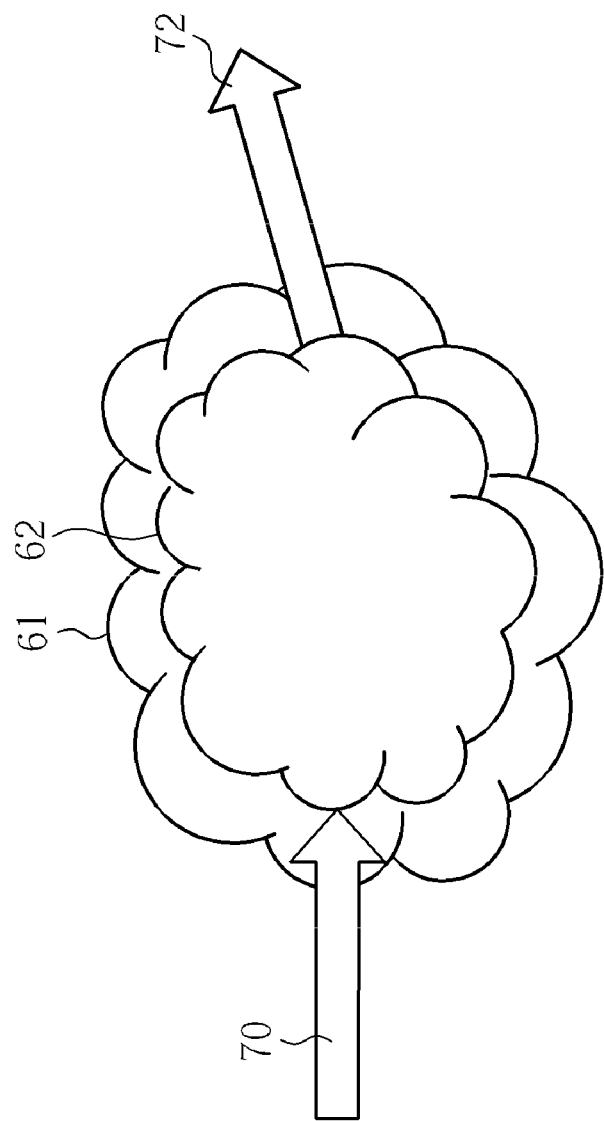
FIG. 1 is a structural schematic diagram of the present invention.

Please refer to FIG. 1 and FIGS. 2a-2d. FIG. 1 is a schematic diagram of the fluorescence powder particle 5. The outer-layer portion 61 of the fluorescence powder particle 5 is defined as diameter length or particle diameter of the particle size and a crystallite portion 62 is disposed inside the outer-layer portion 61. The incident light 70 emitted by semiconductor materials of group III-V includes blue light (420-460 nm) or ultraviolet light (350-410 nm), which will be changed as the emitting light 72 through energy transformation in the crystallite portion 62.

Figure 5A:
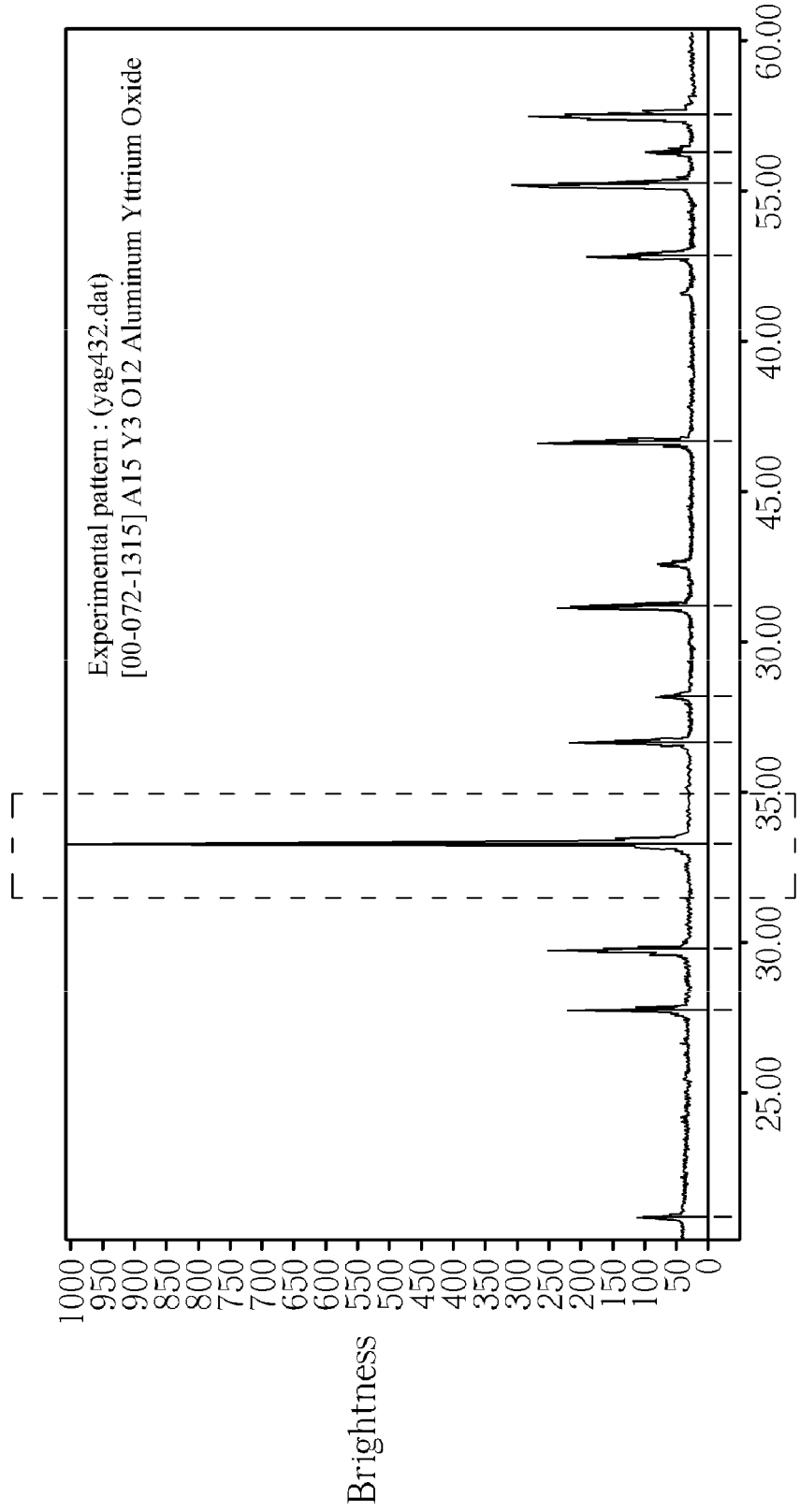
FIG. 5a is an X-ray diffraction diagram of a sample of YAG fluorescence powder with a particle diameter of 6.55 micrometers (μm).
Figure 5B:
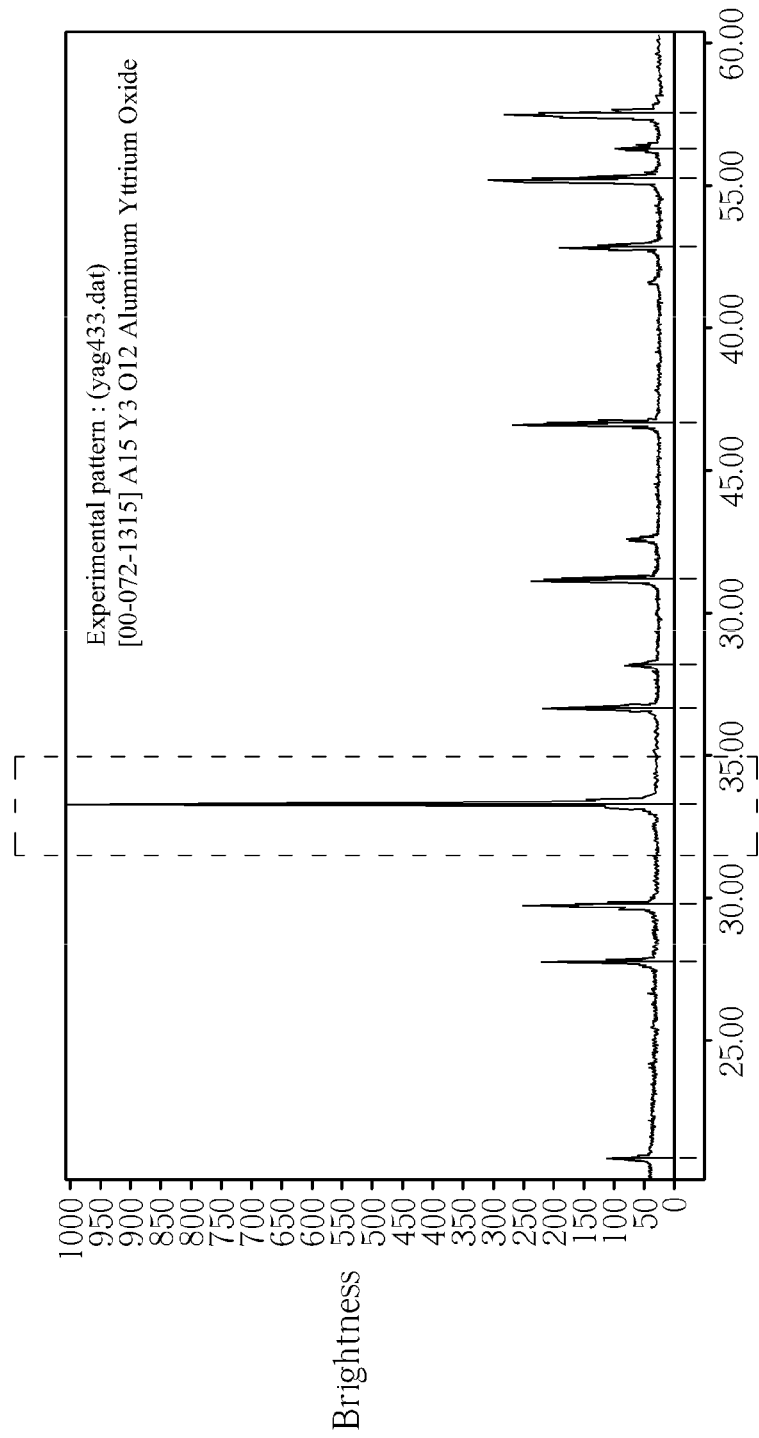
FIG. 5b is an X-ray diffraction diagram of a sample of YAG fluorescence powder with a particle diameter of 12.89 μm.

The samples shown in FIGS. 5a-5b have particle diameters of 6.55 μm and 12.89 μm respectively. According to the Scherrer Equation, the above-mentioned particle diameters of the crystal area can be figured out in accordance with the following equation:

$$d = 0.9\lambda/B \cdot \cos\theta_B$$

In this equation, "d" represents the particle diameter of the crystal area (or called "crystal particle diameter") which is going to be figured out, "λ" represents the wavelength of the incident light, which may be about 1.5405981 Å herein, "B" represents the full-width half maximum (FWHM) of the diffraction strength, and "$\theta_B$" represents the counted diffraction angle.

According to the above-mentioned Scherrer Equation, the crystal particle diameter $d_c$ of the fluorescence powder particle of the sample shown in FIG. 5a is about 100 nm, and the crystal particle diameter of the fluorescence powder particle of the sample shown in FIG. 5b is about 92 nm. As a result, although one of the two samples may have an almost double particle diameter with respect to the other sample, the crystal particle diameters of both the samples are very similar. Therefore, it is proved that the crystal particle diameter will not change and tend to close to a constant value when the particle diameter is larger than a certain value. According to the calculation of the crystal particle diameter, the crystal particle diameter is determined by diffraction angle and FWHM, which means the narrower the FWHM, the larger the crystal particle diameter will be figured out when the diffraction angle is the same. Generally, the emitting-light intensity is greater as the crystal particle diameter is larger. However, it is not desired to make the crystal particle diameter as large as possible. When the crystal particle diameter is too large to reach a certain level, light may be scattered, resulting in losing of emitting-light intensity. In short, by summarizing the above-mentioned information for calculation, the best crystal particle diameter has a range of: 150 nm $\geq d_c \geq$ 10 nm.

Figure 5C:
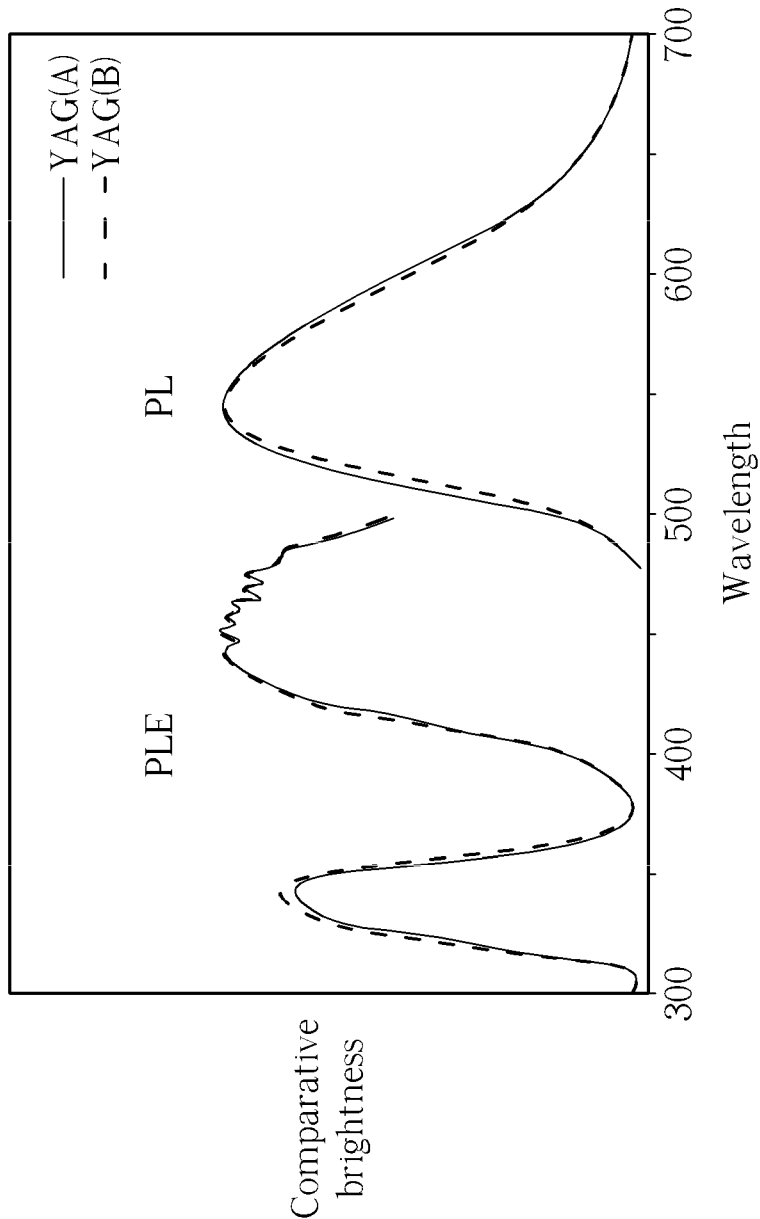
FIG. 5c is a photoluminescence spectrum diagram of the samples shown in FIGS. 5a and 5b, including photoluminescence spectrum and photoluminescence-emission spectrum, wherein the YAG(A) is the sample of YAG fluorescence powder with particle diameter of 6.55 μm, and the YAG(B) is the sample of fluorescence powder with particle diameter of 12.89 μm.

Please refer to FIG. 5c. FIG. 5c shows the comparative brightness of the samples with two different particle diameters. Both the two samples are excited by the photoluminescence light source of the having wavelength of 460 nm emitted from a blue LED chip, and whose photoluminescence emission spectrums are also collected in the figure, wherein the maximum emission wavelength is about 544 nm. In accordance with the measurement result, the two samples have the same measured results, which means the emitting-light intensity of the samples do not increase or decrease while the particle diameter changes and has consistency with the information of crystal particle diameter.

The refractive index of YAG fluorescence powder has a measured value as about 1.8, and the refractive index of the used encapsulation may be varied. Taking silicon, with refractive index of about 1.5, as an example, when light enters the fluorescence powder from outside, total reflection will not occur because light passes from the sparse medium to the dense medium. However, when the energy transformation of the incident light 70 occurs and it is emitted from the fluorescence powder, light will pass through from the dense medium to the sparse medium such that total reflection will occur. As a result, the particle surface of the present invention fluorescence powder is roughened or has some particular structures so as to reduce the total reflection appearance and improve light emitting ratio.

Figure 2A:
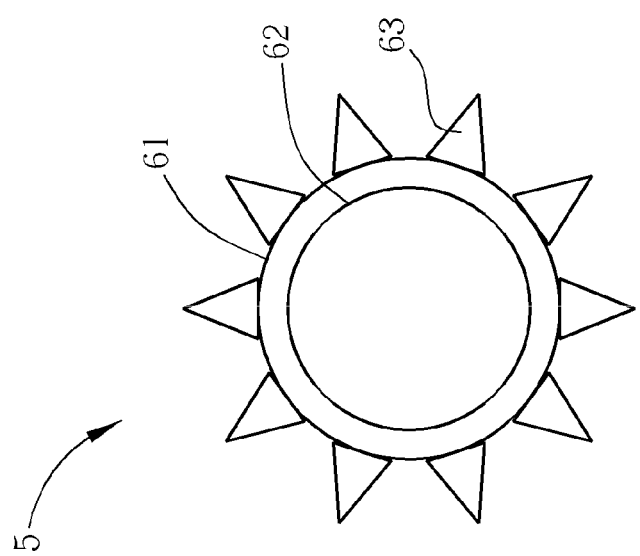
FIG. 2a is a schematic diagram of the structure of the fluorescence powder particle of the present invention, wherein the surface of the particle has triangular tapers.
Figure 2B:
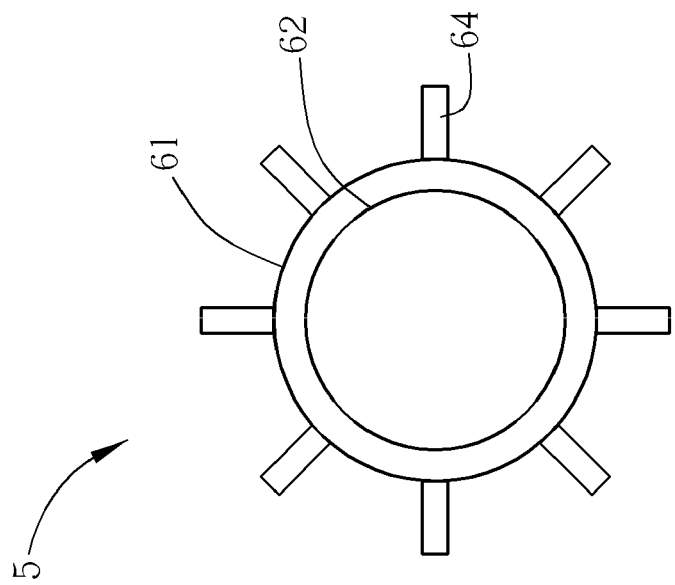
FIG. 2b is a schematic diagram of the structure of the fluorescence powder particle of the present invention, wherein the surface of the fluorescence powder particle has rectangular bars.
Figure 2C:
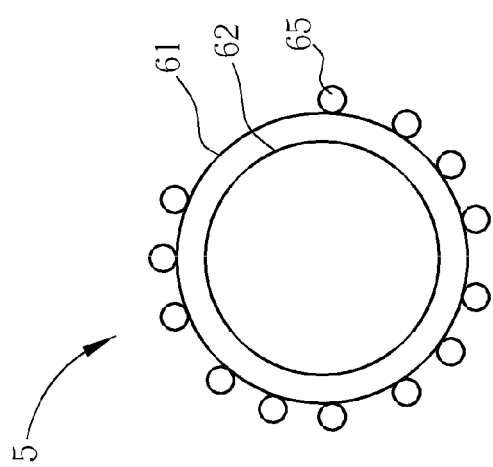
FIG. 2c is a schematic diagram of the structure of the fluorescence powder particle of the present invention, wherein the surface of the fluorescence powder particle has spheres.
Figure 2D:
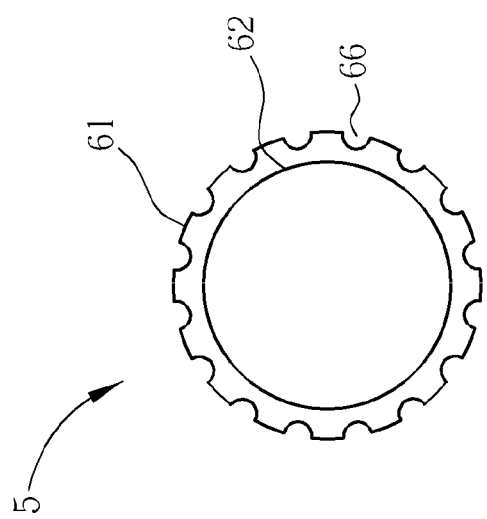
FIG. 2d is a schematic diagram of the structure of the fluorescence powder particle of the present invention, wherein the surface of the fluorescence powder particle has cavities.

Please refer to FIG. 2a to FIG. 2d. In FIG. 2a, the surface fluorescence powder is designed to have triangular tapers 63; in FIG. 2b, the surface of the fluorescence powder is designed to have rectangular bars 64; in FIG. 2c, the surface of the fluorescence powder has spheres 65; and in FIG. 2d, the surface of the fluorescence powder has cavities 66. Accordingly, the possibility of total reflection while light emits from the powder can be reduced, which is achieved by roughening or disposing photonic crystals on the surface of the fluorescence powder as mentioned above, in order to effectively increase the amount of light emitting out of the fluorescence powder.

Figure 4:
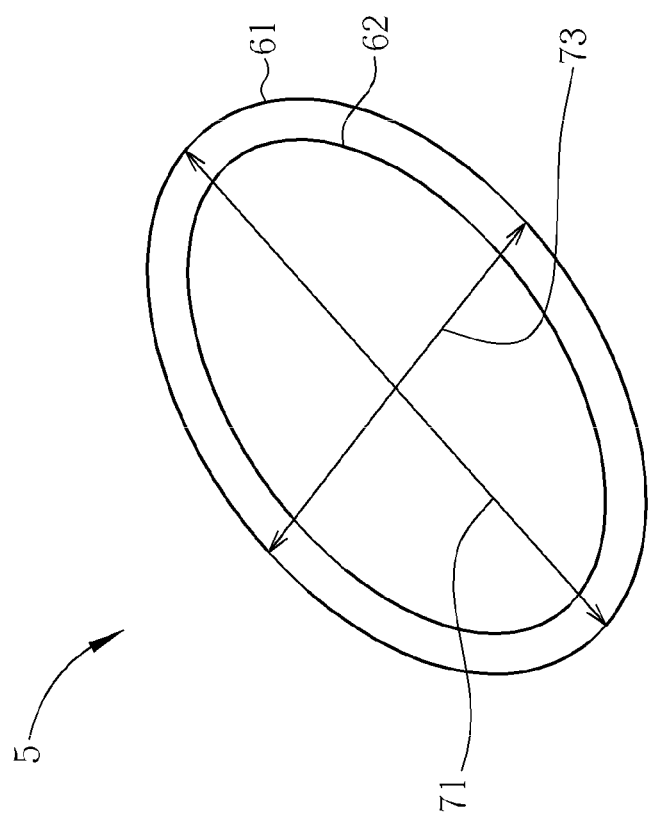
FIG. 4 is a schematic diagram of the fluorescence powder particle of the present invention with a long axis and a short axis.

In addition, according to the present invention, one layer (or sheet) or multi-layer of coating medium with different refractive indexes may be coated on the out surface of the fluorescence powder, wherein the refractive index n of the one-layer or multi-layer of coating medium is substantially in a range from the refractive index value 5 of fluorescence powder to the refractive index value 3 of encapsulation. For example, when the above-mentioned YAG fluorescence powder and silicon encapsulation are adopted, the refractive index n of the coating medium has the limitation: $1.8 \geq n \geq 1.5$. When the YAG fluorescence powder is coated with a plurality of layers of coating medium, the refractive indexes $n_1$, $n_2$ $n_n$ representing the refractive indexes of the different layers of coating medium from the fluorescence powder to the encapsulation in sequence preferably meet the following equation:

With reference to FIG. 4, as the fluorescence powder particle has a non-circular shape, the numeral 73 represents the short axis of the particle diameter of the fluorescence powder, and the numeral 71 represents the long axis of the particle diameter of the non-circular shaped fluorescence powder particle. The ratio of the long axis 71 to the short axis 73 is defined as ratio "r". When light is emitted from the inner portion (crystallite portion) 62 of the fluorescence powder particle, the fluorescence powder having a round shape with uniform particle diameter can have the preferable emission efficiency. However, some synthesizing method cannot precisely form the powder with a round-shape particle, but form the powder with a pillar particle having a dumbbell shape. As a result, the outer-layer portion 61 of the particle 5 preferably meets the following equation: $3 \geq r \geq 1$, and the particle diameter of the fluorescence powder particle preferably has a particle diameter ratio of long axis to short axis in a range from 1 to 3, which provides a preferable emitting efficiency.

Those skilled in the art will readily observe that numerous modifications and alterations of the device and method may be made while retaining the teachings of the invention.

What is claimed is:

1. A fluorescence material applied to a light emitting device, being of a shape having a long axis diameter and a short axis diameter, comprising:
   a crystallized core portion having a diameter $d_c$, and a range of the particle diameter $d_c$ being about $150 \text{ nm} \geq d_c \geq 10 \text{ nm}$;
   at least one coating medium layer coated on the surface of crystallized core portion for surrounding the crystallized core portion; and
   a plurality of microstructures formed on the surface of the at least one coating medium layer to thus reduce the possibility of total reflection of an incident light;
   wherein a ratio of the long axis diameter to the short axis diameter of the fluorescence particle diameter is defined as r, and a range of r meets the equation $3 \geq r > 1$ to thus increase light extraction efficiency of the fluorescence material particle;
   wherein a refractive index of the crystallized core portion $\geq$ a refractive index of the at least one coating medium layer; and
   wherein the plurality of microstructures are a plurality of protrusions of an identical shape or a plurality of cavities of an identical shape formed evenly on the at least one coating medium layer.

2. A fluorescence material applied to a light emitting device, being of a shape having a long axis diameter and a short axis diameter, comprising:
   a crystallized core portion;
   at least one coating medium layer coated on the surface of crystallized core portion for surrounding the crystallized core portion; and
   a plurality of microstructures formed on the surface of the at least one coating medium layer to thus reduce the possibility of total reflection of an incident light;
   wherein a ratio of the long axis diameter to the short axis diameter of the fluorescence material is defined as r, and a range of r meets the equation: $3 \geq r > 1$.

3. The fluorescence material of claim 2, wherein the plurality of microstructures are a plurality of protrusions of an identical shape or a plurality of cavities of an identical shape formed evenly on the at least one coating medium layer.

4. A fluorescence material, comprising:
   a crystallized core portion;
   at least one coating medium layer coated on the surface of crystallized core portion for surrounding the crystallized core portion; and
   wherein a plurality of microstructures formed on the surface of the at least one coating medium layer to thus reduce the possibility of total reflection of an incident light;
   wherein the fluorescence material meets the following equation: a refractive index of the fluorescence material $>=$ a refractive index of the coating medium $>=$ a refractive index of the encapsulation.

5. The fluorescence material of claim 4, wherein the a plurality of microstructures are taper-shaped, rectangular-shaped, or round-shaped.

6. The fluorescence material of claim 4, wherein the plurality of microstructures are a plurality of protrusions of an identical shape or a plurality of cavities of an identical shape formed evenly on the at least one coating medium layer.

7. The fluorescence material of claim 5, wherein the at least a layer of the coating medium comprises a plurality of refractive indexes of $n_1, n_2, \ldots, n_n$ from an inner side to an outer side of the coating medium, and the fluorescence material meets the following equation: the refractive index of the fluorescence material $>= n_1 >= n_2 \ldots >= n_n >=$ refractive index of the encapsulation.

* * * * *